United States Patent [19]

Parker

[11] Patent Number: 5,361,914
[45] Date of Patent: Nov. 8, 1994

[54] DEVICE FOR COMPONENT PROCESSING

[75] Inventor: Tim Parker, Shrewsbury, Mass.

[73] Assignee: Digital Equipment Corporation, Maynard, Mass.

[21] Appl. No.: 131,836

[22] Filed: Oct. 5, 1993

[51] Int. Cl.⁵ .............................................. A47F 5/00
[52] U.S. Cl. ...................................................... 211/41
[58] Field of Search ........................ 211/41, 126, 71; 361/415

[56] References Cited

U.S. PATENT DOCUMENTS

| | | |
|---|---|---|
| 3,730,489 | 5/1973 | Morita . |
| 3,853,590 | 12/1974 | Kadison et al. . |
| 3,903,350 | 9/1978 | Baird . |
| 4,325,992 | 4/1982 | Donovan et al. . |
| 4,588,095 | 5/1986 | Mehra ................................. 211/74 |
| 4,804,007 | 2/1989 | Bran . |
| 4,869,278 | 9/1989 | Bran . |
| 5,031,779 | 7/1991 | Szenay et al. .................... 211/41 X |

*Primary Examiner*—Alvin C. Chin-Shue
*Assistant Examiner*—Sarah Lechok Purol
*Attorney, Agent, or Firm*—Albert P. Cefalo; Ronald C. Hudgens; Barry N. Young

[57] ABSTRACT

Disclosed is an apparatus and method for processing electronic components in an ultrasonic bath. The apparatus includes a tray, which has a number of nests geometrically configured for the admission of the components. In one embodiment the tray is made of a polypropylene core which includes conductive carbon and glass beads as a filler. Plated over the core is a metallic sheath, which is actually formed of three layers of metal. The metal encapsulation of the core serves to appreciably reduce the amount of contaminants released by the tray during component processing. Additionally, the metallic sheath prevents static electricity from building up and damaging the components during processing, and provides added structural integrity to the polypropylene core at process temperatures which exceed the softening temperature of the core.

16 Claims, 6 Drawing Sheets

DEVICE FOR COMPONENT PROCESSING

FIELD OF THE INVENTION

This invention relates to a tray device that is used to hold an electronic component, such as an integrated circuit chip, during debonding or cleaning operations.

BACKGROUND OF THE INVENTION

In connection with the fabrication of integrated circuit chips, the chips undergo a number of processes, including cutting, grinding, and so on. After such processing it is necessary to dissolve the adhesive bond between the chip and a transfer tool, to which the chip is attached for processing. Additionally, it is necessary to clean the chips to remove deposits and particulates that will contaminate the chip and cause the failure of the chip or the assembly into which it is ultimately installed. During such cleaning operations, the chip is mounted in a tray, and then subjected to a cleaning solution or bath.

One problem that has been experienced in connection with polymeric cleaning trays is that, during the cleaning operation, the mechanical interactions of the chips, the tooling, and the tray may cause the material composition of the tray to break down. Therefore, fractured portions of the tray, or the fillers included in the tray material, may become a form of debris which could contaminate the chips. Additionally, some trays, which are made of plastic, may deform when they are exposed to a hot solvent bath, or hot air or nitrogen drying, thereby allowing the chips to become dislodged from the tray nests.

Another problem experienced with polymeric cleaning trays is that when they are used with an ultrasonic rinse process in high purity deionized water(18 megohm), a film of micro-air bubbles forms on the plastic surfaces. This occurs as dissolved air is expelled from the water as traces of a surfactant used in the ultrasonic cleaning process are removed in the rinse cascade. As a result, the film of air bubbles erradicates any benefits of ultrasonic cleaning by inhibiting cavitation.

One potential solution to the problem of the air bubbles is to de-gas the water; however, this approach has not proven to be practically feasible. Another potential solution is to add a low concentration of a surfactant/wetting agent as a rinse aid; however, even when used in the hundredth of a percent concentration range, surfactant residue may occur.

Yet other trays that are made of metal, glass, or ceramic may cause chips placed in them to be damaged, especially if such a tray is used in connection with an ultrasonic bath. This is due to the effect of the ultrasonically induced vibration of the chips against the rigid metal, glass, or ceramic structure.

Accordingly, what is needed is a chip tray that does not cause the release of any appreciable amount of contaminants into the cleaning process of the chips. It is also desirable to have a tray that maintains its structural integrity when exposed to hot solvents, and can be used in connection with an ultrasonic or recirculating bath without damaging the chips mounted in it. And, it is desirable to have a tray that can be used in an ultrasonic rinse process using high purity deionized water, without having the formation of micro-air bubbles, and without having to use a rinse aid which may result in an accumulation of residue.

SUMMARY OF THE INVENTION

This invention involves a tray for processing an electronic component. The tray includes a core made of a polyolefin material, such a polypropylene. In specific embodiments, the core is filled with a conductive carbon and glass beads. Layered over the core is a metallic sheath, which is electrically conductive and which imparts structural integrity to the tray.

Formed in the tray is a nest for the admission of a component which is to be processed in the tray. To the extent the nest is for the accommodation of the component, the nest is geometrically configured for the admission of the component, such that the component securely sets in its nest.

Other embodiments of the invention included the tray together with a cover, which is used in conjunction with the tray to enclose components in the tray during processing. Yet other embodiments of the invention include the method of processing components using the tray.

Given that this description only briefly summarizes the invention, a more complete understanding of the invention, as well as its objects, features, and advantages will be appreciated upon consideration of the following detailed description of the preferred embodiment, presented in conjunction with the accompanying drawings, and the claims.

DETAILED DESCRIPTION OF THE PREFERRED EMBODIMENT

Figure 1:
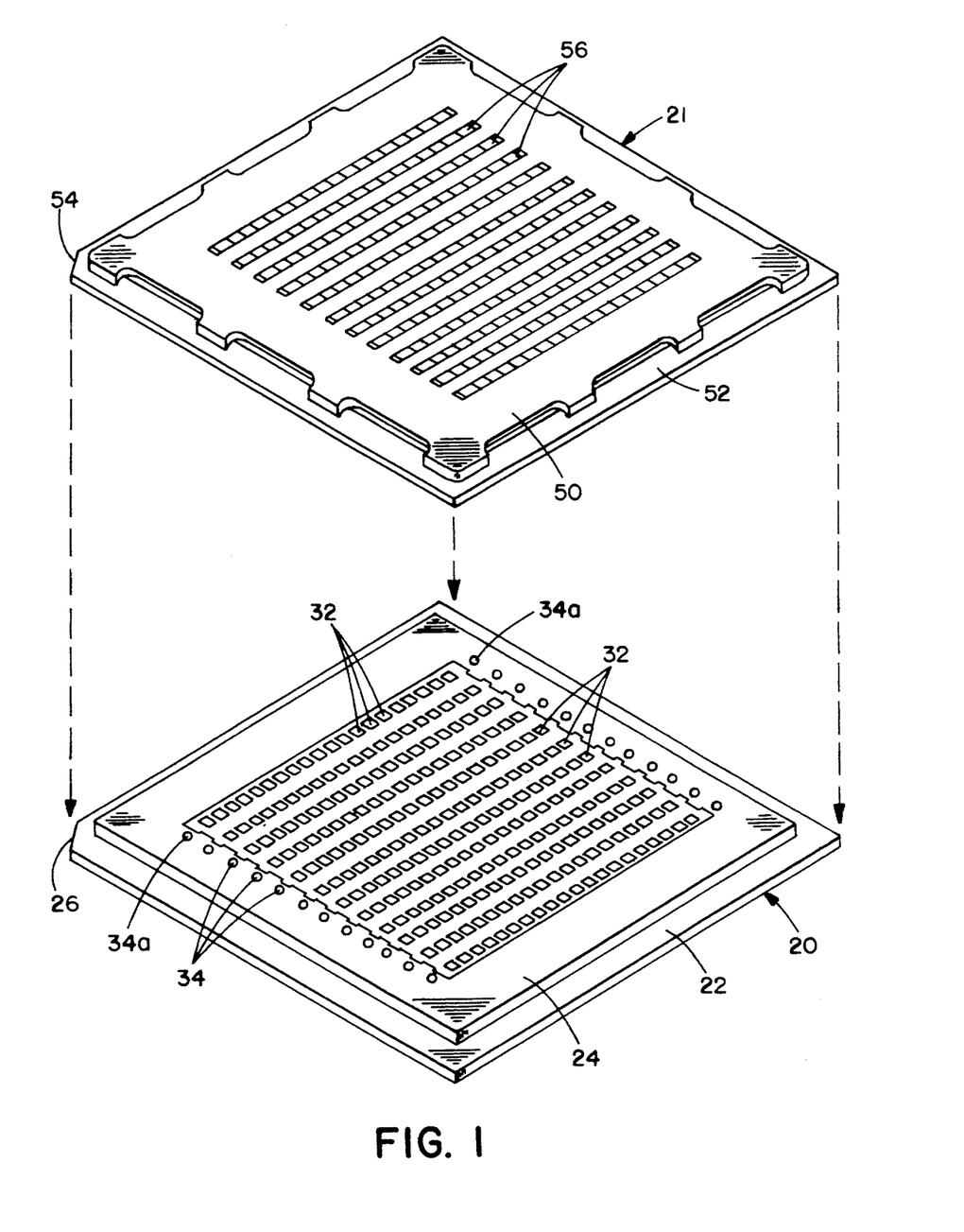
FIG. 1 is an exploded, isometric view of a chip tray and tray cover in accordance the present invention.

Referring first to FIG. 1, an exploded, isometric view of an embodiment of a chip processing tray 20 and a mating cover 21 is shown. In this particular embodiment and when viewed from the top, tray 20 has a square shape, with each side measuring approximately 4 inches. Tray 20 includes upper and lower bases, respectively 22 and 24, with lower base 22 including a registration detent 26 for aligning tray 20 during processing.

In the central portion of base there are approximately 240 chip nests 30, which are for holding the chips that are processed in tray 20. In FIG. 1 a detailed view of each nest 30 is not provided; however, as will be explained in connection with the enlarged and detailed illustration in FIG. 3A, each nest 30 includes a rectangularly shaped hole 32 through tray 20, and such holes 32 are visible in FIG. 1. Furthermore, although no chips are shown in the embodiment provided in FIG. 1, FIG.

Figure 3A:
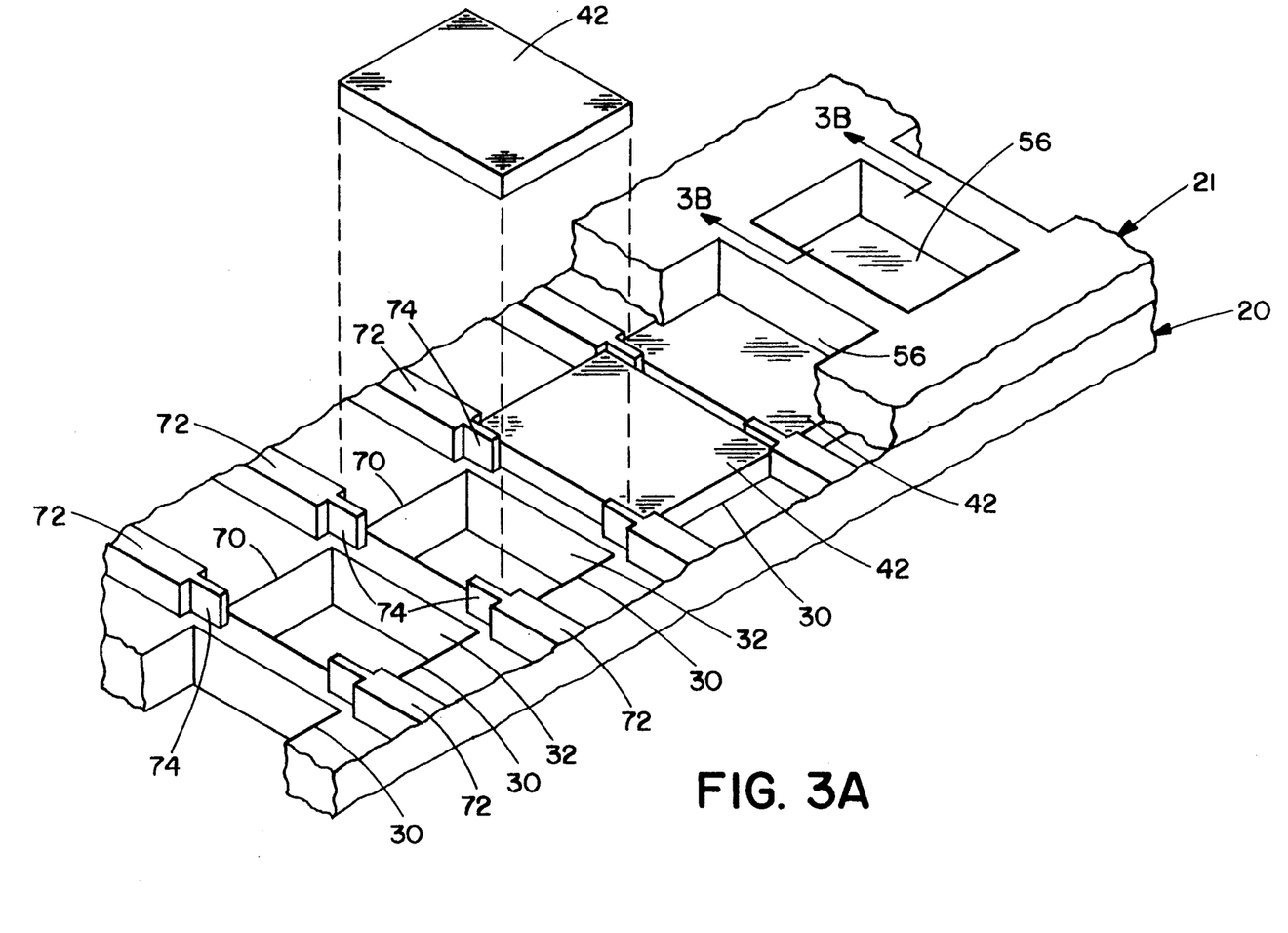
FIG. 3A is an isometric, sectional view of a portion of the tray cover of FIG. 1, positioned on the tray, and chips mounted in or disposed above their nests.

3A shows four chips (reference number 42), one of which is seated in its nest 30.

Also shown on FIG. 1 are a number of registration holes 34 around two sides of the central portion having the nests 30. Each hole, such as 34a in FIG. 1, is paired with one other hole, also 34a in FIG. 1, at the opposite end of a row of nests 30, so that a given pair of holes 34 can be used to align a transfer tool (shown in FIG. 2 as reference number 40). The transfer tool is used to machine and transfer chips into their respective nests 30 and cover the top of tray 20 during certain chip processing operations, as will be discussed below.

Still referring to FIG. 1, cover 21 is designed to matingly enclose the top of tray 20 when it is placed over tray 20. Due to the mating relationship between cover 21 and tray 20, cover 21 has a design and configuration quite similar to tray 20. For example, when viewed from the top, cover 21 likewise has a square shape, with each side measuring approximately 4 inches. Cover 21 includes upper and lower bases, respectively 50 and 52, with lower base 52 including a registration detent 54 for orienting tray 20 during processing. As suggested by the downward arrows in the illustration, when cover 21 is placed over tray 20, the bottom side of lower base 52 of cover 21 will be positioned adjacent to the top side of lower base 22 of tray 20. Likewise, the bottom side of upper base 50 of cover 21 will be positioned adjacent to the top side of upper base 24 of tray 20.

Similar to tray 20, in the central portion of cover 21 there are approximately 240 rectangular holes 56, each such hole 56 corresponding to the holes 32 of tray 20, discussed above. As will be detailed below, holes 56 are for allowing the free flow of a fluid, such as a liquid solution, when the chips are being processed.

Figure 2:
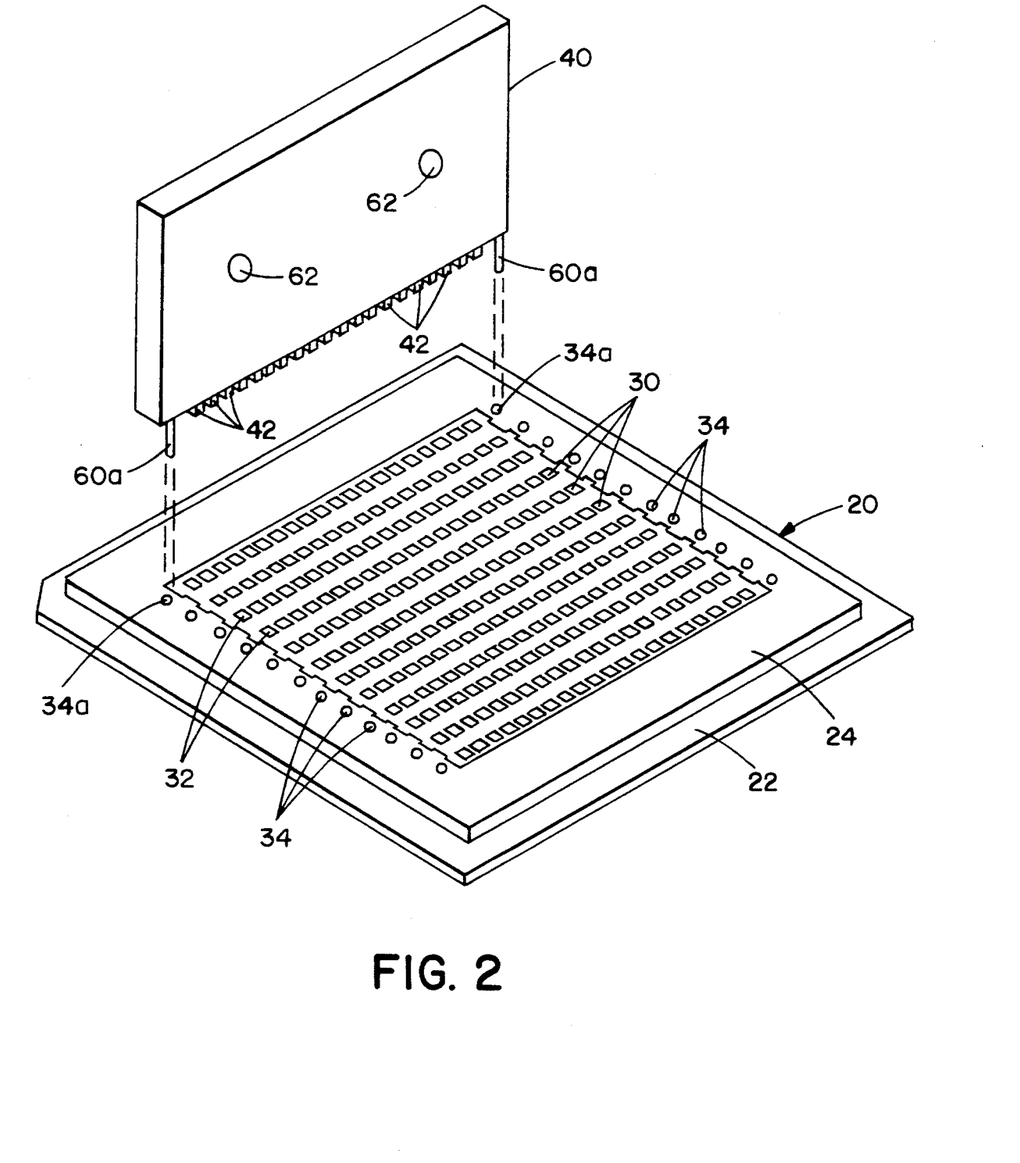
FIG. 2 is an isometric view of the chip tray of FIG. 1, with a transfer tool on which is bonded a number of chips positioned over the tray.

Referring now to FIG. 2, an illustration similar to that provided in FIG. 1 is provided; however, in FIG. 2 a transfer tool 40 is positioned above tray 20 for transferring chips 42 into their respective nests 30. As shown in FIG. 2, chips 42 are positioned on the underside of transfer tool 40. In one application of tray 20, chips 42 could be the read/write heads that are used in connection with a computer disk drive; however, tray 20 can be configured to accommodate many different types of electronic components for processing.

It should be noted that in an early stage of chip 42 manufacture, a single bar (not shown) would first be adhesively bonded to the underside of transfer tool 40. That bar is then subjected to a cutting operation, the end result of which is that the original single bar is sliced into the multiple chips 42 shown on the bottom of transfer tool 40 in FIG. 2. Even after such dicing, the adhesive bond of chips 42 to transfer tool 40 is maintained in order to facilitate the handling of the tiny chips as they are subjected to additional processing operations, such as grinding, polishing, and the like. After all such processes, however, transfer tool 40 is then mounted in relation to tray 20 so that the adhesive bond can be dissolved in order to separate the chips 42 from transfer tool 40. Further details relating to the debond, and also chip cleaning operations, are provided below.

In order to make the precise alignment of transfer tool 40 with tray 20 more simple, the transfer tool 40 has paired registration pins 60a, which matingly engage a corresponding pair of holes 34a when transfer tool 40 is lowered onto tray 20.

Although not shown in any of the drawings, it should be noted that a number of transfer tools 40 can be positioned side by side over tray 20. Such side by side positioning of multiple transfer tools 40 somewhat resembles the appearance of a number of dominoes positioned side by side. As seen in FIG. 2, transfer tool 40 has two registration holes 62. When a number of transfer tools 40 are positioned side by side, a so-called "pickle fork" (not shown) is passed through the registration holes 62 as a means of holding multiple transfer tools 40 together. When lowered in position, the paired registration pins 60a of each transfer tool 40 matingly engage a corresponding pair of holes 34, such as 34a, in a manner similar to that shown in FIG. 2. Accordingly, each of the nests 30 of tray 20 would have a chip 42 positioned therein, though chip 42 would be slightly suspended above the nest 30 due to the fact that it would still be adhesively bonded to transfer tool 40.

Referring now to FIG. 3A, a more detailed, but partial, isometric view of tray 20 and cover 21, shown in FIG. 1, is provided. FIG. 3A is intended to illustrate the manner in which cover 21 matingly engages the top side of tray 20, thereby keeping chips enclosed therein during chip processing. Additionally, FIG. 3A is intended to illustrate the mating relationship between nests and chips.

In the right side of FIG. 3A, a sectioned portion of cover 21 is in position over tray 20, and three chips 42 are enclosed within their respective nests. In FIG. 3A, one of the chips 42 is shown to be secured within the enclosure formed by tray 20 and cover 21, while the other chips 42 are only partially enclosed, due to the sectional drawing of cover 21. Yet another chip 42 is shown to be suspended above tray 20 to better illustrate the manner in which the body of chip 42 mates with its nest 30. In the left side of FIG. 3A, the tray cover 21 shown in the right portion of the illustration has been sectioned away revealing two, adjoining chip nests 30. Also, in the right portion of FIG. 3A, it can be seen that holes 56 are centrally positioned above each nest 30 and the enclosed chips 42, such that a fluid will pass freely in and out of each hole 56 and around the nested chip 42.

It should be noted that FIG. 3A is intended to illustrate the mating relationship between the design of each nest 30 and its corresponding chip 42, and therefore does not actually show the manner in which chips 42 would be placed in their respective nests 30 by transfer tool 40. In other words, in FIG. 3A one of the chips 42 is individually suspended above its nest 30 in the drawing, while another is shown to already be in its nest 30. As discussed above in connection with FIG. 2, in the preferred method of chip mounting, chips 42 bonded to a given transfer tool 40 are positioned in their respective nests 30 simultaneously as transfer tool 40 is lowered onto the tray 20, as opposed to individual chip placement, as may be suggested by FIG. 3A. FIG. 3A is nonetheless drawn for the purpose of showing a detailed view of a nest 30 and its relationship with chip 42, when chip 42 is placed in it.

Referring now to the empty nest 30 in FIG. 3A, it can be seen that each nest 30 includes a flat, rectangular seat 70 for supporting chip 42, with hole 32 passing generally through its center. Given that each chip 42 has a tiny, box-like shape, seat 70 is adapted for supporting one of the faces of chip 42. In a different embodiment of the invention, nest 30 could be configured to accommodate the design of a differently shaped component.

As indicated above, each seat 70 has a generally rectangular hole 32 disposed through its center, which is visible in FIGS. 1-3A. When tray 20 is placed in a fluid, such as the solution of an ultrasonic bath, hole 32 will permit the flow of a fluid so that the solution passes generally all around the chip 42 being processed.

Adjoining nests 30 are defined by, and therefore share, rectangularly shaped bars 72, which project orthogonally from the plane defined by the flat surface of the seats 70 on tray 20. Disposed against the smaller sides of each rectangular bar 72 is yet a smaller rectangular post 74, which is centered relative to the small side of rectangular bar 72.

As will be discussed below, during one portion of the processing of chips 42 they are debonded, and thereby detached, from transfer tool 40. Assuming such detaching occurs when transfer tool 40 is properly positioned with respect to tray 20, chip 42 will drop into nest 30. With chip 42 in nest 30, rectangular bars 72 and posts 74 provide the surfaces that prevent the side to side movement of chip 42 once it is separated from transfer tool 40. Additionally, the bottom of chip 42 is supported by seat 70. Thus, the combined surfaces of bars 72, posts 74, and seat 70 restrain chip 42 on five sides. The sixth side, namely the top side of chip 42 shown in FIG. 3A, is restrained by the underside of transfer tool 40, given that during certain chip processing operations transfer tool 40 remains positioned above tray 20. Alternatively, during other chip processing operations, the top side of chip 42 may be restrained by the underside of cover 21, when it is positioned over tray 20.

Figure 3B:
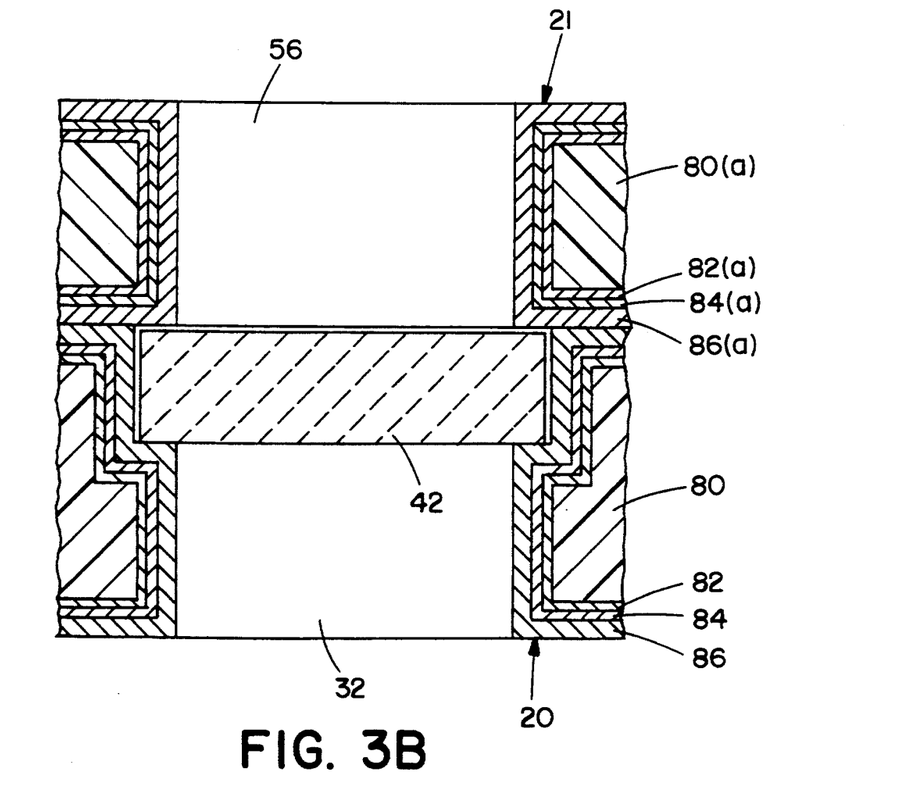
FIG. 3B is a sectional view of a portion of the tray and tray cover shown in FIG. 3A, as sectioned along the line 3B.

Referring now to FIG. 3B, a partial view of tray 20 and cover 21 shown in FIG. 3A is shown, as sectioned along line 3B. Through the sectioned view it can be seen that tray 20 and cover 21 each include a core 80, which is made of a polyolefin. In the preferred embodiment, core 80 is formed of a polypropylene base resin. It should be noted that although FIG. 3B is cross hatched to indicate that the core 80 material is a polyolefin, core 80 has been processed to further include a conductive carbon in the amount of 20–30 parts per hundred parts of the base resin.

Advantageously, it has been found that the inclusion of the conductive carbon makes core 80 receptive to plating with a metallic layer. Polypropylene was selected for its inertness in the solvents used in the chip/tool separation process, but unmodified polypropylene is not readily platable. On the other hand, the etchants used in the tray manufacturing process described below are efficient in acting on the conductive carbon filler in the polypropylene so that core 80 readily accepts a metallic coating. Additionally, composite metallic coating makes tray 20 conductive, so that the tray 20 will not build up an electrostatic charge which could attract contaminants during chip processing or damage the chips 42 processed in the tray 20. It is believed that the metallic sheath conducts stray static charges to core 80, which, due to the conductive carbon, acts as a capacitor and absorbs any static charge surges which are harmlessly dissipated over time.

Core 80 further includes a glass filler. In the preferred embodiment, the glass filler is soda lime glass beads in the amount of 10–40 parts per hundred parts of the base resin.

In order to actually make tray 20, an injection molding process can be used to form the core 80. After the formation of core 80, in a shape that is effectively the same as the shape that is shown in FIG. 1, the core 80 is further plated with metallic coatings. In the preferred embodiment, core 80 is coated with a sheath comprised of three metallic layers, 82, 84, 86, as detailed below.

Figure 4:
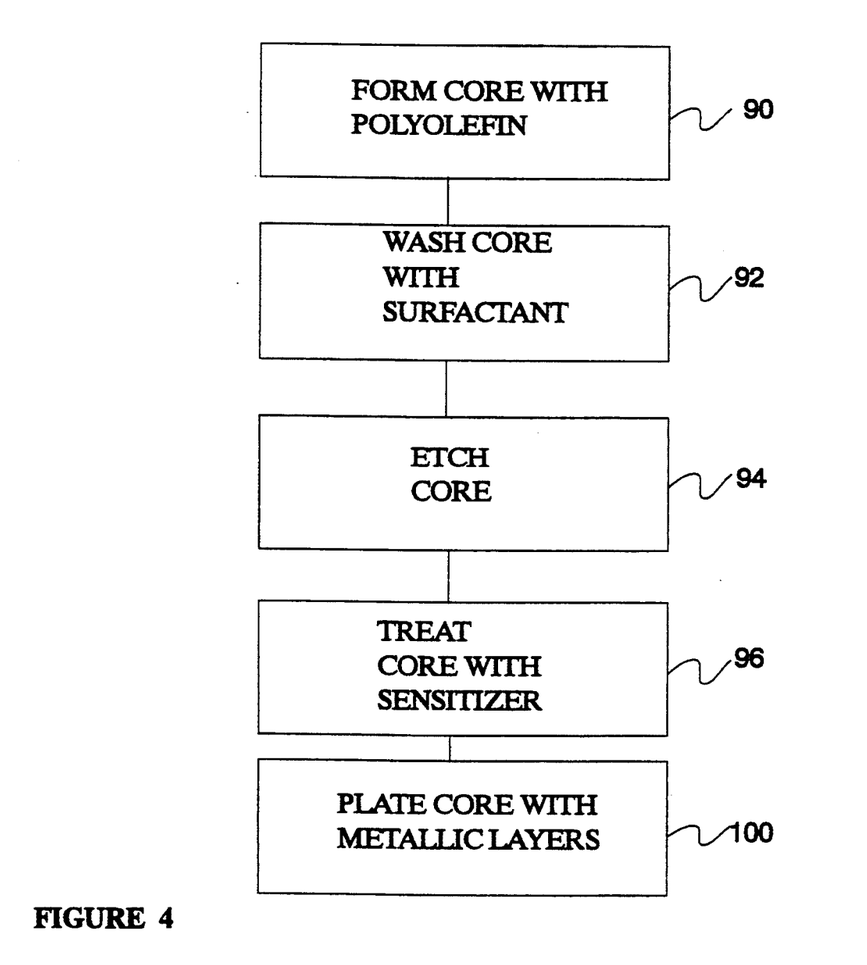
FIG. 4 is a flow diagram illustrating the method by which the chip tray and cover of FIG. 1 are constructed.

Referring now to FIG. 4, a flow diagram is provided for describing the preferred method by which tray 20 and cover 21 are constructed. It should be noted that the description focuses upon the construction of tray 20; however, cover 21 can be constructed in the same manner. Accordingly, in FIG. 3B the sectioned view shows cover 21 to be made up of a core 80a, and three metallic layers 82a, 84a, 86a, where the suffix "a" is intended to indicate that the manufacturing process and the core and metallic encapsulation layers are the same for tray 20 and cover 21.

Core 80 is first formed by means of an injection molding process, using the polypropylene resin containing conductive carbon and glass beads (step 90). After injection molding, core 80 is washed with a surfactant solution, which is mixed with water at 1% by weight solution of the surfactant (step 92). Although there may be a number of surfactants that can remove mold releases, water soluble contaminants, and dirt, Union Carbide's TRITON ® X-100 ethoxylated octylphenol has produced satisfactory results.

After such washing, core 80 is etched with an etchant, which in the preferred method is chromic acid. Core 80 could alternatively be etched with other solutions, such as a combination of chromic acid and sulfuric acid; hydrofluoric acid; hydrofluoric acid in combination with nitric acid; an alkali, such as sodium hydroxide or potassium hydroxide; or an alkali salt. The etchant is preferably applied by means of the immersion of core 80 in a bath containing the etch solution (step 94).

After etching, core 80 is then treated with a sensitizer to make it more receptive to the plating process (step 96). For example it has been found stannous chloride alone, or stannous chloride combined with hydrochloric acid is a satisfactory sensitizer.

After the etch and sensitizer treatment, core 80 is next plated with an electroless copper, thereby forming layer 82, shown in FIG. 3B, having an approximate thickness of 3–8 microns. The first coating is followed by a second plating of an electroless nickel layer 84, also in FIG. 3B and also having a thickness of 3–8 microns. Finally, a third layer 86, in FIG. 3B, of electroplated nickel is deposited so that the total thickness of the metallic sheath over the polypropylene core 80 is approximately 25–50 microns (step 100). At this thickness, the metallic sheath does not affect the dimensional fit of chips 42 with tray 20 and cover 21.

Although it has been indicated that cover 21 can be made in the same manner as tray 20, in an alternate embodiment, cover 21 could be made with a polycarbonate base resin material which is embedded with conductive carbon in the proportions identified above. In this alternate embodiment, no glass beads filler is included.

Figure 5:
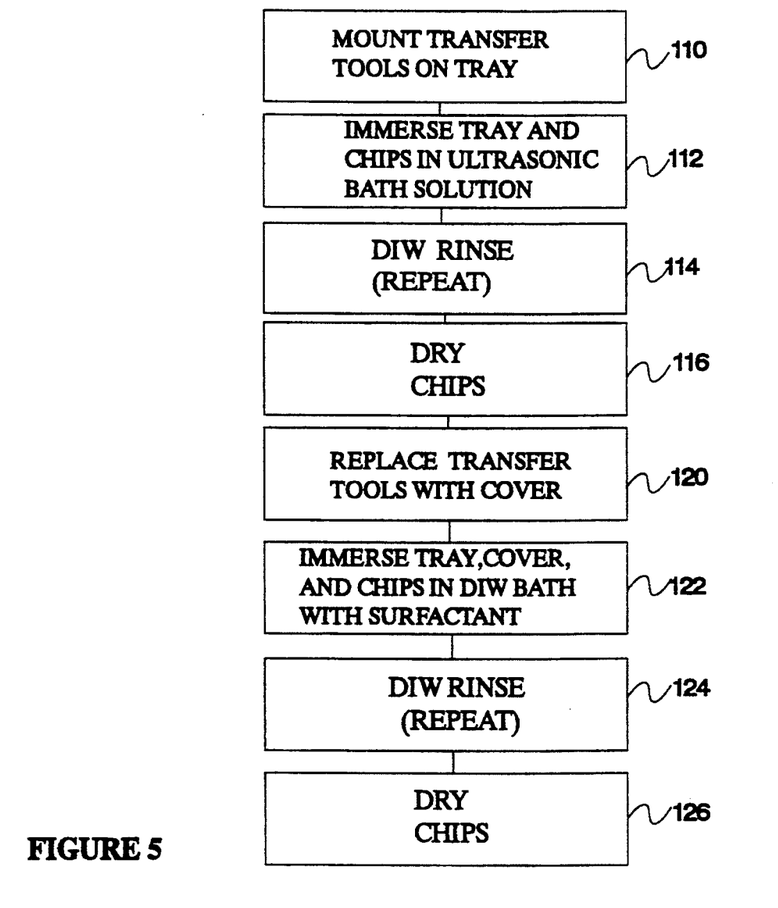
FIG. 5 is a flow diagram illustrating the method by which the chip tray and cover of FIG. 1 are used to process chips.

Referring now to FIG. 5, a flow diagram is provided to describe the method by which tray 20, transfer tool 40, and cover 21 are used for processing chips 42. For the purpose of this explanation it will be assumed that a number of transfer tools 40 are used to transfer and position the full 240 chips 42, which tray 20 is capable of accommodating, to their respective nests 30. Each such transfer tool 40 would have chips 42 adhesively bonded to the transfer tool 40 such that part of the processing of the chips 42 is for the purpose of dissolving the adhesive, and subsequently cleaning the chips 42.

The process commences with the positioning of the transfer tools 40 relative to the tray 20, such that the chips 42 are mounted in their respective nests 30 (step 110). The tray 20 and the transfer tool 40 assembly is then immersed in an ultrasonic bath containing a solution of an aprotic solvent, such as dimethyl formamide, dimethyl acetamide, N-methyl pyrrolidone, or butyrolactone. The bath is operated at a frequency of 40 KHz for approximately 10 minutes, at which point the chips are debonded from the transfer tool (step 112). It should be noted that the positioning of transfer tools 40 above tray 20 does not create a water tight seal between those two components. Additionally, holes 32 in tray 20 will naturally admit the free flow of the solution in the bath. Accordingly, when immersed in the bath, chips 42 will be generally surrounded by the bath solution so that the solution is able to dissolve the bonding agent, holding chips 42 to transfer tool 40.

With the transfer tool 40 still in place, the chips 42, tray 20 and transfer tool are then rinsed in a second ultrasonic bath containing de-ionized water (DIW) (step 114). Again the frequency of the ultrasonics is 40 KHz, and it lasts for approximately 5 minutes. The same rinse process is repeated in a third tank of even cleaner DIW for another 10 minutes (step 114). Then the assembly is dried for 10 minutes under hot air or a nitrogen stream (step 116).

After the above described debond operation, the transfer tool is removed, as the chips have fallen away from the transfer tool and are seated in their respective nests. Then cover 21 is placed over tray 20 (step 120), and the assembly is transferred to an ultrasonic washing bath containing deionized water and a surfactant (step 122). At this stage of the preferred process, a fluorocarbon or an organosilane surfactant mixed with a hydrocarbon surfactant is needed. Satisfactory results have been achieved by using a combination of one part of DuPont's ZONYL FSO-100 together with two parts of Texaco's SURFONIC® N-100, the combination then being mixed with deionized water in a concentration of 0.1%. Alternatively, 3M Company's FLUORAD® FC-431 could substitute as the surfactant, or DuPont's FSN-100 or 3M's FC-430 could be substituted in higher concentration. Finally, the organosilane surfactant, SILWET® L-77, could be used as a substitute for FSO-100.

The chips 42 are processed for approximately 5 minutes in the ultrasonic bath containing the surfactants. They are then rinsed and re-rinsed using deionized water (step 124). Thereafter, the chips 42 are dried by blowing hot air or nitrogen through the tray/cover assembly (step 126). After drying, the chips 42 are ready to be sorted and packed for further processing, such as the integration of chip 42 into a higher level assembly. Again, it should be noted that the holes 32 in tray 20 and the holes 56 in cover 21 will admit the free flow of the fluids in the baths in which the tray/cover assembly is immersed.

It has been discovered that as a result of using tray 20 for processing chips 42 as described, there is no appreciable releasing of contaminants by tray 20 when exposed to the debond and cleaning solutions. This is attributed largely to the encapsulation of the polypropylene, containing carbon and glass fillers, within the metallic layers discussed above. Additionally, the metallic layers and conductive carbon filler prevents the build up of any static charges which may attract contaminates or damage the electrically sensitive chips.

The metallic sheath over core 80 also prevents the formation of air bubbles in the DIW rinse, such that it is not necessary to de-gas the water or add in any surfactant/wetting agents in the rinse process, which could cause the formation of an undesired residue.

Furthermore, it has also been found that as a result of having the metallic layers 82, 84, 86 encapsulating the polypropylene core 80, the coating provides structural integrity to tray 20 such that during the exposure to the hot solvent in the ultrasonic bath or hot air/nitrogen used in drying, the shape of tray 20 is not distorted such that chips 42 can be dislodged from tray 20. This is so, even though the solvents used in the above described processes may range in temperature from 60°–115° C., and the hot air or nitrogen drying stage may be done at approximately 95° C.

On the other hand, it has also been found that as a result of the polypropylene core 80, which tends to be somewhat flexible, some of the vibratory impact of the ultrasonic bath is actually dampened such that chips 42 are not damaged during ultrasonic processing.

This detailed description has focused upon the use of tray 20 in connection with the processing of chips 42, such as the read/write heads of a disk drive. It will be evident, however, that tray 20 can be reconfigured to hold any number of different electronic components for processing, without departing from the spirit or scope of this invention. This is especially so given that tray 20 is made through an injection molding process, which can readily accommodate different tray and nest shapes. For example, the nests 30 of tray 20 could be reconfigured in order to accommodate the holding of the bars out of which the chips are made for processing prior to the time that the bars are bonded to the transfer tool 40.

Accordingly, the invention in its broader aspects is not limited to the specific details, representative apparatus, and illustrative examples shown and described herein. Thus, departures may be made from such details without departing from the spirit or scope of the invention.

What is claimed is:

1. A tray for processing an electronic component comprising:
   a core made of a polyolefin material;
   a metallic sheath layered over said core; and
   a nest formed in said layered core, said nest being geometrically configured for the admission of a component for processing in the tray.

2. The tray as in claim 1 wherein said polyolefin is polypropylene.

3. The tray as in claim 1 wherein said core includes carbon.

4. The tray as in claim 1 wherein said core includes a glass filler.

5. An apparatus for processing an electronic component comprising:
   a tray having a core made of a polyolefin material and carbon, over which is layered a metallic sheath; and
   a nest formed in said tray, said nest being geometrically configured for the admission of the component.

6. The apparatus as in claim 5 wherein said carbon is electrically conductive.

7. The apparatus as in claim 6 wherein said conductive carbon is in the amount of 20–30 parts per one hundred of the polyolefin.

8. The apparatus as in claim 5 wherein said polyolefin is polypropylene.

9. The apparatus as in claim 5 wherein said core includes a glass filler.

10. The apparatus as in claim 9 wherein said glass filler is in the amount 10-40 parts per hundred of the polyolefin.

11. The apparatus as in claim 5 wherein said metallic sheath includes electroless copper.

12. The apparatus as in claim 5 wherein said metallic sheath includes electroless nickel.

13. The apparatus as in claim 5 wherein said metallic sheath includes electroplated nickel.

14. The apparatus as in claim 5 further comprising a cover, said cover being configured to be joined with said tray for securely enclosing a component set in said nest.

15. The apparatus as in claim 14 wherein said cover has a core made of a polyolefin material and carbon, over which is layered a metallic sheath.

16. The apparatus as in claim 14 wherein said cover has a core made of a polycarbonate material and carbon, over which is layered a metallic sheath.

* * * * *